United States Patent
Ioi

(10) Patent No.: US 6,911,820 B2
(45) Date of Patent: Jun. 28, 2005

(54) PHASE DETECTION DEVICE, DIAL TYPE DETECTION DEVICE, AND PHASE DETECTION METHOD

(75) Inventor: Toshiaki Ioi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 110 days.

(21) Appl. No.: 10/666,181

(22) Filed: Sep. 19, 2003

(65) Prior Publication Data

US 2004/0119506 A1 Jun. 24, 2004

(30) Foreign Application Priority Data

Sep. 20, 2002 (JP) ........................................ 2002-275710

(51) Int. Cl.[7] ............................................... H03D 3/00
(52) U.S. Cl. ........................ 324/208; 327/2; 250/214 C
(58) Field of Search ................................ 324/248, 208, 324/207, 227, 233, 236, 238, 4; 318/656; 702/72, 71, 73; 327/2

(56) References Cited

U.S. PATENT DOCUMENTS 6,351,154 B2 * 2/2002 Brachmann ................. 327/12

FOREIGN PATENT DOCUMENTS

JP    Sho 57-175260    10/1982

* cited by examiner

Primary Examiner—David Porta
Assistant Examiner—Tony Ko
(74) Attorney, Agent, or Firm—Sheridan Ross PC

(57) ABSTRACT

A phase detection device with low power consumption capable of accurately detecting that an object has moved, and returning from an intermittent energized mode to an always energized mode is provided. The phase detection device according to the present invention comprises a first phase detector for detecting a phase of an object, a second phase detector, a power supply section having an always energized mode for always supplying a power to the first and the second phase detectors, and an intermittent energized mode for intermittently supplying the power to the first and the second phase detectors, and a control section for, in the intermittent energized mode, storing detection phases of the first phase detector and the second phase detector just before shifting to the intermittent energized mode from the always energized mode, and when both detection phases of the first phase detector and the second phase detector change from stored detection phases of the first phase detector and the second phase detector, changing the power supply section from the intermittent energized mode to the always energized mode.

7 Claims, 15 Drawing Sheets

PHASE DETECTION DEVICE, DIAL TYPE DETECTION DEVICE, AND PHASE DETECTION METHOD

BACKGROUND OF THE INVENTION

The present invention relates to a phase detection device, a dial type detection device, and a phase detection method.

In many electronic devices, a dial type detection device has been used as means for a user to input an operation command. The dial type detection device comprises a rotatable dial and a phase detection device for detecting a rotation phase of a dial. The electronic device derives a rotation direction and a rotation angle of the dial based on two phases (Generally, the phase is different from each other by $\pi/2$.) which the phase detection device outputs, and based on those information, performs, for example, a cursor movement on an image display screen, a display content change (for example, an increment or a decrement of displayed numeric values or the like), or other processes.

By installing the phase detection device in a lever (A traveler is installed thereto similar to a case where a rotator is installed in the dial which is mentioned later.) which performs a straight line movement, a movement direction and an amount of movement of the control lever can be detectable. The electronic device inputs the operation command from the user through the control lever incorporating the phase detection device. An operation direction of the control lever and a detection method of the amount of movement are similar to a method of the dial type detection device mentioned later. The following discussion is described by taking an example of the dial type detection device.

The phase detection device of a prior art is described using FIGS. 6–14. As the phase detection device of the prior art, the phase detection devices which employ a magnetic system, an optical system, and a mechanical system are proposed.

FIG. 6 is a block diagram showing a configuration of a phase detection device of the prior art 1 incorporated in the dial type detection device. The dial type detection device is mounted on an operation panel of the electronic device. The phase detection device of the prior art 1 employs the magnetic system. In FIG. 6, symbols 20a and 20b are magnetic flux detecting sections and symbol 31 is a power supply section. A multi-pole magnetized magnet of a ring shape (rotor) is fixed to a bottom surface of the dial that the user rotatably operates, along the periphery or the bottom surface. The magnetic flux detecting sections 20a and 20b are always supplied a power from the power supply section 31, detects a magnetic field (magnetic flux density) which the magnet fixed to the dial generates, and generates two binarized signals, the phase of which is different from each other by $\pi/2$ (Referred to as an A phase output voltage or an A phase output signal, or a B phase output voltage or a B phase signal.), respectively.

FIG. 8 is a time chart showing the A phase output voltage that the magnetic flux detecting section 20a outputs, and the B phase output voltage that the magnetic flux detecting section 20b outputs. A microcomputer of the electronic device receives the A phase output voltage and B phase output voltage, the phase of which is different from each other by $\pi/2$, and based on which phase is advanced, can detect the rotation direction of the dial. By counting a change in the amount of the phase of the A phase output voltage and/or the B phase output voltage, the rotation angle of the dial can be derived. In a patent document 1 (JP-A-57-175260), "a rotation direction detection device of the prior art", which employs a pickup coil, is described.

For example, by inputting either of the binarized A phase output voltage and B phase output voltage which the phase detection devices output (the phase is different from each other by $\pi/2$) into a clock input terminal of a D flip-flop, and inputting the other into a data input terminal, the D flip-flop outputs a rotation direction detection signal (For example, it is Q output signal and a value 0 or 1 indicates a rotation direction.). Moreover, by inputting the A phase output voltage (or the B phase output voltage) into a clock input terminal of an UP/DOWN counter, and inputting the rotation direction detection signal into an UP/DOWN switching terminal, a count value of the UP/DOWN counter indicates the rotation direction and the rotation angle of the dial type detection device. The electronic device performs a predetermined process based on information about the rotation direction and the rotation angle of the dial type detection device.

The phase detection device of a prior art 2 incorporated in the dial type detection device is described using FIG. 6. The phase detection device of the prior art 2 employs the optical system. In FIG. 6, symbols 20a and 20b are photo interrupters, in which diodes and photo transistors are positioned to oppose on both sides of a slit, (Other optical sensors, such as a photo reflector may be used.), and symbol 31 is a power supply section. A ring-shaped plate (rotor) provided with light shield sections (typically black stripes) and transparent sections extending radially are alternately arranged around the perimeter is fixed to the bottom surface of the dial that the user rotatably operates. The ring-shaped plates inserted in the slits of the photo interrupters 20a and 201b pass through or interrupt the light which the light emitting diode emits towards the photo transistor. The photo interrupters 20a and 20b generate two binarized signals (A phase output voltage and B phase output voltage), the phase of which is different form each other by $\pi/2$, respectively.

The phase detection device of a prior art 3 incorporated in the dial type detection device is described using FIG. 7. The phase detection device of the prior art 3 employs the mechanical system. In FIG. 7, symbols 40a and 40b are switches, each of which has a mechanical actuator and a switching mechanism, symbols 41a and 41b are resistors, and symbol 31 is a power supply section. A ring-shaped plate (rotor), in which irregularities are formed along the periphery, is fixed to the bottom surface of the dial that the user rotatably operates. Switches 41a and 41b are arranged so that contact points may be short-circuited according to a rotation angle of the dial, and timing when the contact points are short-circuited may be different from each other by $\pi/2$. A junction point between the resistor 41a and the switch 40a, and a junction point between the resistor 41b and the switch 40b output two binarized signals (A phase output voltage and B phase output voltage), the phase of which is different from each other by $\pi/2$, respectively.

In recent years, in such phase detection devices, the needs from the market for reducing the power consumption has been rapidly increased for the purpose of equipping them in portable equipment or the like. As an approach for reducing the power consumption of the phase detection device, other than achieving a low voltage drive of the phase detection device, there is an approach that, when the user does not operate the dial type detection device for a predetermined time, the power supply to the phase detectors of the phase detection devices (symbols 20a and 20b in FIG. 6, resistor 41a and switch 40a, resistor 41b and switch 40b in FIG. 7)

is changed from an always energized mode to an intermittently energized mode (Referred to as sleep function.) (Referred to as sleep mode.).

FIG. 9 is a block diagram showing a configuration of a phase detection device of a prior art 4 of the mechanical system which has the sleep function. FIG. 10 is a time chart showing a signal waveform of each section of the phase detection device of the prior art in FIG. 9. The phase detection device of the prior art 4 is installed in the dial type detection device. The phase detection device of the prior art, comprises: a sleep detection function for detecting that the rotor has not moved for a certain period of time; and a power activation condition detection function wherein a first phase detector (resistor 41a and switch 40a) or a second phase detector (resistor 41b and switch 40b) detects the rotor has moved in the sleep mode.

In FIG. 9, symbol 31 is a power supply, symbol 30 is a switch for the power supply, and symbol 91 is a control section. A resistor 41a and a switch 40a configure the first phase detector, and a resistor 41b and a switch 40b configure the second phase detector. The control section 91 has first-fourth memory sections 10a–10d (each of them is a D flip-flop.), a decoder 61, and a state control section 60. The decoder 61 has exclusive OR gates 12a and 12b, and an OR gate 63.

The first-fourth memory sections 10a–10d and the decoder 61 perform the power activation condition detection function, wherein the first phase detector (resistor 41a and switch 40a) or the second phase detector (resistor 41b and switch 40b) detects that the dial or the like (rotor) has moved in the sleep mode. The state control section 60 receives the A phase output signal (signal outputted from an A junction point between the resistor 41a and the switch 40a), and the B phase output signal (signal outputted from a B junction point between the resistor 41b and the switch 40b), and performs the sleep detection function for detecting that the rotor has not moved for a certain period of time, The state control section 60 makes the phase detection device shift to the sleep mode from the always energized mode when the sleep detection function works. When the power activation condition detection function works, it makes the phase detection device shift to the always energized mode from the sleep mode. The switch for the power 30 always brings a current flowing from the power supply 31 to the first phase detector and the second phase detector into conduction in the always energized mode, intermittently brings it into conduction in the sleep mode, and cuts off it in other modes.

In FIG. 10, symbol A is the A phase output signal and symbol B is the B phase output signal. Symbols 10a–10d, 12a, 12b, 63, and 60 are the output signals of blocks with the same symbol, respectively. Symbols ST and SC are an ST signal and an SC signal which are mentioned later, respectively.

In FIG. 10, first, the state control section 60 is in the always energized mode. By the user rotating the dial (rotor) in a certain direction until a certain time, the B phase output signal continuously changes following to the A phase output signal with a phase delay by $\pi/2$. From a certain time to a time ts (predetermined time), the sleep detection function works based on both the A phase output signals and the B phase output signals being unchanged, the state control section 60 shifts to the sleep mode from the always energized mode, and makes the output signal ST High (it is High in the sleep mode, and Low in the always energized mode. Referred to as ST signal.). The first memory section 10a and the third memory section 10c latch the A phase output signal and the B phase output signal (both are binary) just before shifting to the sleep mode with a rising edge of the ST signal. The first memory section 10a and the third memory section 10c store the A phase output signal and the B phase output signal until the next rising edge of the ST signal arrives, and input those signals into the exclusive OR gates 12a and 12b, respectively.

Subsequently, based on a command from the state control section 60, the switch for the power 30 cuts off the power supply to the two phase detectors (resistor 41a and switch 40a, resistor 41b and switch 40b). Therefore, the A phase output signal and the B phase output signal become Low. Subsequently, the commands are sent to the switch for the power 30 for every predetermined period from the state control section 60, and the switch for the power 30 supplies the power to two phase detectors for every predetermined period. The state control section 60 intermittently outputs a scanning signal SC (Hereinafter referred to as SC signal.) only for a sleep period. The second memory section 10b and the fourth memory section 10d latch the A phase output signal and the B phase output signal (both are binary) with a rising edge of the SC signal. The second memory section 10b and the fourth memory section 10d store the A phase output signal and the B phase output signal until the next rising edge of the SC signal arrives, and input those signals into the exclusive OR gates 12a and 12b, respectively.

The output signal of the exclusive OR gate 12a is a logic change judging result between the A phase output signal before shifting to the sleep mode and the A phase output signals at each scanning time ts (1)–ts (n). The output signal of the exclusive OR gate 12b is a logic change judging result between the B phase output signal before shifting to the sleep mode and the B phase output signals at each scanning time. The OR gate 63 receives the output signals of the exclusive OR gates 12a and 12b, and outputs a logical sum of them. When a value of either the A phase output signal or the B phase output signal changes from a value just before changing to the sleep mode, the output signal of the OR gate 63 becomes High.

Since a state between the time ts and the time ts (1) is in a state where a first scanning signal has not arrived yet, values which the second memory section 10b and the fourth memory section 10d latch are not correct, and outputs of the OR gate 63 during this period can not be used as it is. The state control section 60 does not use the output signals of the OR gate 63 until the first scanning signal is outputted.

Hereafter, the process of the power activation condition detection after the time ts (1) until a time tw when it moves out from the sleep period is described.

With the rising edge of the SC signal at the time ts (1), the A phase output signal and the B phase output signal are latched by the second memory section 10b and the fourth memory section 10d. The data output of the second memory section 10b is inverted from Low to High, and since the output of the exclusive OR gate 12a is Low and the output of the exclusive OR gate 12b is still Low, the output of the OR gate 63 becomes Low and the sleep period is maintained.

At a time ts (x), when only either the A phase output signal or the B phase output signal in the scanning time (in FIG. 10, B phase output signal) changes from the A phase output signal or the B phase output signal just before shifting to the sleep mode, the output of the exclusive OR gate 12b becomes High, and the output of the OR gate 63 changes to High. The state control section 60 receives an output signal (power activation condition detection signal is active at High) of the OR gate 63. The state control section 60 changes from the sleep mode to the always energized mode. The state control section 60 energizes the switch for the power 30, and the switch for the power 30 always energizes two phase detectors (switch and pull-up resistor).

Not having such contact wear as the mechanical system because of a non-contact system, the phase detection device of the magnetic system is highly reliable, and is low in power dissipation and in cost as compared to the optical system.

As the phase detector of the magnetic system, a Hall device, magnetoresistive elements, ICs, in which even the function for discriminating the output voltage of the Hall device with a certain fixed threshold value and outputting the binarized output signal is integrated (hereinafter referred to as Hall IC), or the like are employed.

In order that these Hall device and Hall IC may consume a current of several mA as an operating current, it becomes a large burden to use them in the state of always supplying the power against battery capacity of a portable device equipped with these elements.

However, in the magnetic system, when using the phase detector by intermittently supplying the power thereto, the problem which has not been found in the mechanical system would be generated.

FIG. 11 shows a configuration of the Hall IC which has been largely employed as a common phase detector. In FIG. 11, symbol 80 is a Hall device for detecting a magnetic flux density (magnetic field), symbol 81 is an amplifier for amplifying the magnetic flux density detection voltage of the Hall device, and symbol 82 is a binarizer having hysteresis (Schmitt trigger type buffer). FIG. 12 is an example of a characteristics chart showing the relationship between an input magnetic flux density of the Hall IC (horizontal axis), and a magnetic flux detection voltage (vertical axis).

The Hall IC has a hysteresis characteristic so that a stable logical output signal (binary output signal) to the magnetic flux density may be outputted. That is, the Hall IC sets a dead zone to the input magnetic flux density so that an output signal may not be made to respond to a change in a very small magnetic flux density with ease (Referred to as a state holding function.).

However, since the Hall IC does not have a state holding function corresponding to the intermittent drive operation at a power supply terminal and does not have a power supply reset function, when turning the power on in the state where the magnetic flux whose level is within upper and lower threshold values of the hysteresis of the input magnetic flux density (Hereinafter referred to as hysteresis region.) is inputted, an initial value of the Schmitt trigger type buffer becomes an indefinite state, and the magnetic flux detection voltage also becomes an indefinite state. During the conduction period, this indefinite state permanently keeps that state until a magnetic flux input level exceeding the upper and lower hysteresis threshold values arrives.

FIG. 13 is a chart showing the relationship between the input magnetic flux density (the vertical axis is input magnetic flux density) and the output voltage waveform (the vertical axis is voltage) of the phase detector (the horizontal axis is time), when assuming that the change of the magnetic flux density roughly draws a sign curve to the rotation angle or the movement distance.

Slash portions of the output voltage waveform in the figure are output voltage indefinite regions corresponding to a hysteresis region. After stopping the rotor or the traveler in the hysteresis region, when the power supply of the phase detector is cut off once and the power supply is turned on again, the phase detector does not necessarily output the same detection output voltage as before the power supply cutoff.

Parts (a) and (b) of FIG. 14 are waveform charts of the A phase output signal and the B phase output signal of the phase detector, (the vertical axis is output voltage of each phase detector, and the horizontal axis is time), when assuming that the phase detector of the magnetic system is intermittently energized.

In part (a) of FIG. 14, at X point or Z point, or X' point or Z' point, no indefinite region exists in both the A phase output signal and the B phase output signal. By taking measures against the phase detection device so that the rotor may not stop within the indefinite region by any means, when making the rotor always stop at X or Z, or X' or Z' point, the problem of the indefinite output by the intermittent power supply of the phase detector described above can be avoided. However, in an actual phase detection device, to take such measures is mechanically difficult. When an unexpected operation is made by the user under an actual operating condition, for example, when the rotor is left within the indefinite region for a long time, incorrect power activation condition detection signals are continuously outputted from the phase detector, and such problems that remaining capacity of the battery of the device equipped with the phase detection device is exhausted or the like may be generated.

In order to avoid this problem, irrespective of where a stop point of the rotor or the traveler may exist, it is needed to accurately judge whether the rotor or the traveler has moved or not.

In part (a) of FIG. 14, assuming now that the rotation angle or the movement distance comes into a standstill at the point of W in the figure for a certain period of time, and it enters the sleep mode at this point. In the case of this magnetic system, when an intermittent operation is performed, as for the B phase output signal shown in the lower chart, even in a state where a position coordinate of the rotor or the traveler is not moved, it becomes indefinite which output voltage, that is, High or Low detection output, may appear in the intermittent operation. When only the B phase output signal changes, it cannot be judged whether it is because the rotor or the traveler has actually moved or because of the indefinite output according to the intermittent operation. Similarly, when it also enters the sleep mode at the point of W' in part (a) of FIG. 14, when only the A phase output signal changes, it cannot be judged whether it is because the rotor or the traveler has actually moved or because of the indefinite output according to the intermittent operation.

Therefore, the same method as the power activation condition detection method in the phase detection device according to the prior art mechanical system has not been applied to the phase detection device of the magnetic system.

SUMMARY OF THE INVENTION

The object of the present invention is to provide a phase detection device with low power consumption and without occurrence of malfunction, which operates a phase detector having hysteresis in an intermittent energized mode, and only when a rotor (or a traveler) has actually moved during an intermittent drive, changes the operation from the intermittent energized mode to an always energized mode; and a dial type detection device and a phase detection method.

In order to solve above problems, the present invention has following configurations. A phase detection device according to one aspect of the present invention, comprises: a first phase detector having a first detecting section for detecting a phase of an object, and a first binarization section for binarizing the phase which the first detecting section has detected by setting hysteresis; a second phase detector having a second detecting section for detecting a phase of the object in a phase different from the first phase detector, and a second binarization section for binarizing the phase which the second detecting section has detected by setting hysteresis; a power supply section having an always energized mode for always supplying a power to the first phase detector and the second phase detector, and an intermittent energized mode for intermittently supplying the power to the first phase detector and the second phase detector; and a control section for, in the always energized mode, when detection phases of the first phase detector and/or the second phase detector do not change for more than a predetermined time, making the power supply section shift to the intermittent energized mode, in the intermittent energized mode, storing the detection phases of the first phase detector and the second phase detector just before shifting to the intermittent energized mode from the always energized mode, and when both the detection phases of the first phase detector and the second phase detector change from the stored detection phases of the first phase detector and the second phase detector, changing the power supply section from the intermittent energized mode to the always energized mode.

In the above phase detection device according to another aspect of the present invention, the control section, comprises: a first exclusive OR gate for receiving a stored detection phase of the first phase detector, and a phase which the first phase detector outputs; a second exclusive OR gate for receiving a stored detection phase of the second phase detector, and a phase which the second phase detector outputs; and an AND gate for receiving an output signal of the first exclusive OR gate and an output signal of the second exclusive OR gate, wherein in the intermittent energized mode, when the AND gate outputs a signal indicating that both detection phases of the first phase detector and the second phase detector have changed, the power supply section is changed from the intermittent energized mode to the always energized mode.

The above phase detection device according to another aspect of the present invention, comprises: a first memory section for storing the phase which the first phase detector outputs, using a sleep signal indicating the intermittent energized mode as a trigger input; a second memory section for storing the phase which the first phase detector outputs, using a scanning signal outputted when the power supply section intermittently supplies the power in the intermittent energized mode as a trigger input;

a third memory section for storing the phase which the second phase detector outputs, using the sleep signal as a trigger input; and a fourth memory section for storing the phase which the second phase detector outputs, using the scanning signal as a trigger input, wherein the first exclusive OR gate receives an output signal of the first memory section and an output signal of the second memory section; and the second exclusive OR gate receives an output signal of the third memory section and an output signal of the fourth memory section.

In above phase detection device according to another aspect of the present invention, the first phase detector and the second phase detector detect magnetic flux, magnetic fields, or those changes.

A dial type detection device according to another aspect of the present invention has any of above phase detection devices.

The phase detection device according to another aspect of the present invention, comprises: a first phase detector having a first detecting section for detecting a phase of an object, a first binarization section for binarizing the phase by receiving the phase which the first detecting section detects and by feeding back a signal which a fifth memory section stores for setting hysteresis, and the fifth memory section for storing an output signal of the first binarization section; a second phase detector having a second detecting section for detecting a phase of the object in a phase different from the first phase detector, a second binarization section for binarizing the phase by receiving the phase which the second detecting section detects and by feeding back a signal which a sixth memory section stores for setting hysteresis, and the sixth memory section for storing an output signal of the second binarization section; a power supply section having an always energized mode for always supplying a power to the first detecting section and the second detecting section, and an intermittent energized mode for intermittently supplying the power to the first phase detecting section and the second phase detecting section; and a control section for, in the always energized mode, when detection phases of the first phase detector and the second phase detector do not change for more than a predetermined time, making the power supply section shift to the intermittent energized mode, and in the intermittent energized mode, storing the detection phases of the first phase detector and the second phase detector just before shifting to the intermittent energized mode from the always energized mode, and when at least either of detection phases of the first phase detector and the second phase detector changes from the stored detection phases of the first phase detector and the second phase detector, changing the power supply section from the intermittent energized mode to the always energized mode.

The fifth memory section and the sixth memory section are always energized even in the intermittent energized mode. Instead of this, these memory sections may be configured with nonvolatile memories.

In the always energized mode, the first binarization section and the second binarization section may set the hysteresis by feeding back the output via the fifth memory section and the sixth memory section, and may set the hysteresis by directly feeding back the output bypassing the fifth memory section and the sixth memory section.

A phase detection method according to another aspect of the present invention, comprises: an always energized mode having a first phase detection step for detecting a phase of an object by always supplying a power to a first detector, and binarizing the detected phase by setting hysteresis, and a second phase detection step for detecting a phase of the object in a phase different from the first phase detection step by always supplying the power to a second detector, and binarizing the detected phase by setting hysteresis; and an intermittent energized mode having a first phase detection step for detecting a phase of the object by intermittently supplying the power to the first detecting section, and binarizing the detected phase by setting hysteresis, and a second phase detection step for detecting a phase of the object in a phase different from the first phase detection step by intermittently supplying the power to a second detecting section, and binarizing the detected phase by setting hysteresis, wherein in the always energized mode, when detection phases of the first phase detector and the second phase detector do not change for more than a predetermined time, shift to the intermittent energized mode occurs, and in the intermittent energized mode, the detection phases of the first phase detector and the second phase detector just before shifting to the intermittent energized mode from the always energized mode are stored, and when both the detection phases of the first phase detector and the second phase detector change from the stored detection phases of the first phase detector and the second phase detector, change from the intermittent energized mode to the always energized mode occurs.

According to the present invention, an advantageous effect which can realize the phase detection device with low power consumption and without occurrence of malfunction, which operates the phase detector having the hysteresis in the intermittent energized mode, and only when the rotor (or traveler) has actually moved during the intermittent drive, changes the operation from the intermittent energized mode into the always energized mode; the dial type detection device and the phase detection method.

Although a new feature of the invention is exactly what is particularly described in the scope of the appended claims, the present invention regarding both configurations and contents will be well understood and evaluated with other objects or features according to the detailed discussion discussed below, which will be understood with the accompanying drawings.

BRIEF DESCRIPTION OF THE DRAWINGS

FIG. 14 is a waveform chart of an A phase output signal and a B phase output signal of a phase detector when assuming that a phase detector of a magnetic system is intermittently energized;

DETAILED DESCRIPTION

Hereafter, embodiments which specifically show the best configuration for carrying out the present invention are described with accompanying drawings.

<<Embodiment 1>>

Figure 1:
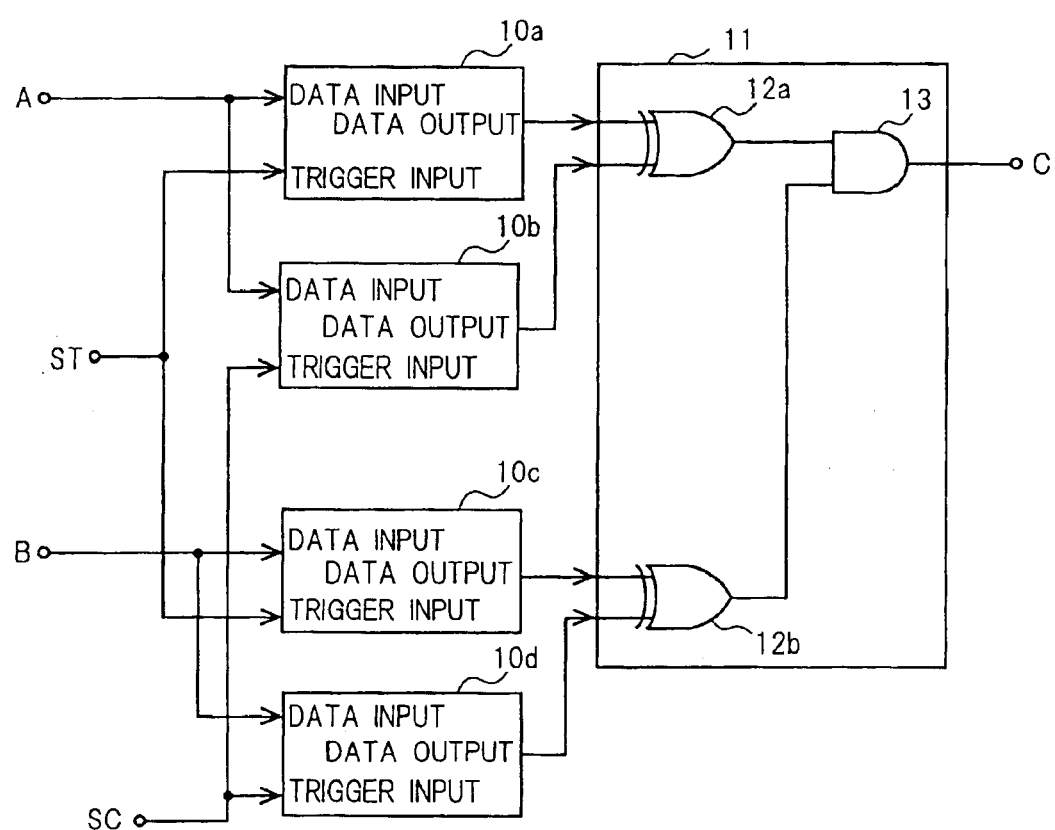
FIG. 1 is a block diagram showing a configuration of a main section of a control section of a phase detection device in an embodiment 1 according to the present invention.
Figure 2:
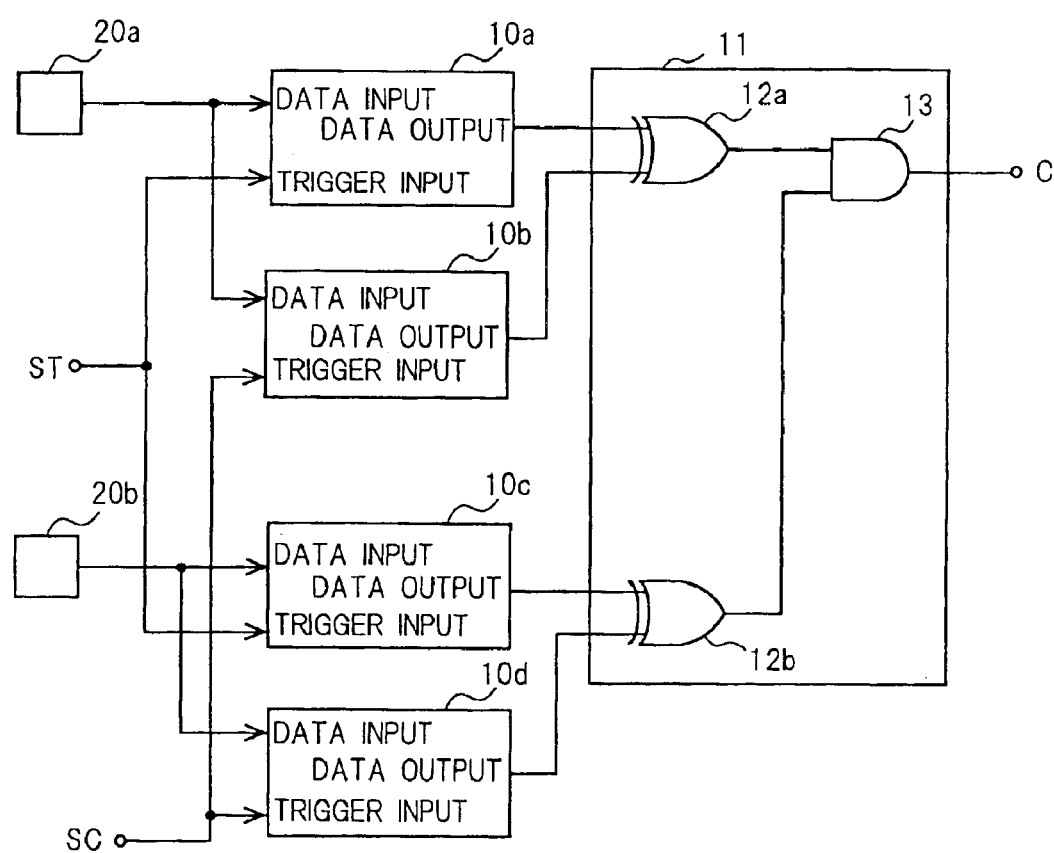
FIG. 2 is a block diagram showing a configuration of a main section of a phase detection section and a control section of a phase detection device in the embodiment 1 according to the present invention.
Figure 3:
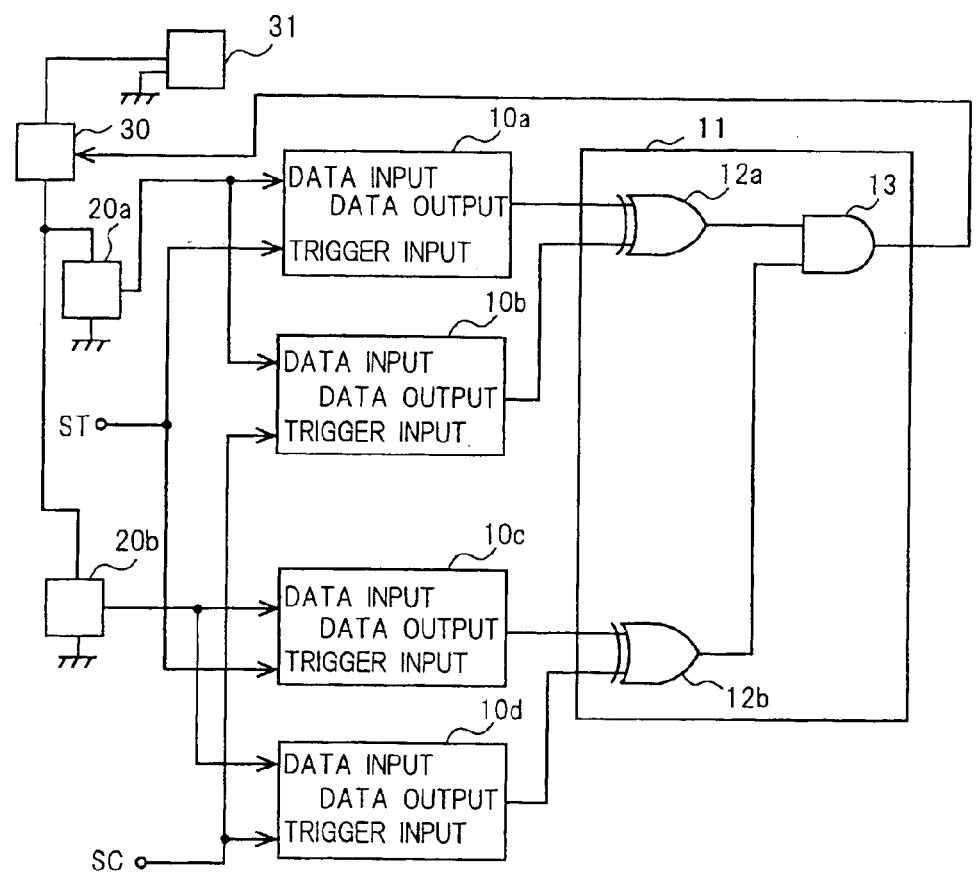
FIG. 3 is a block diagram showing a configuration of a main section of a power supply section, a phase detection section and a control section of a phase detection device in the embodiment 1 according to the present invention.
Figure 4:
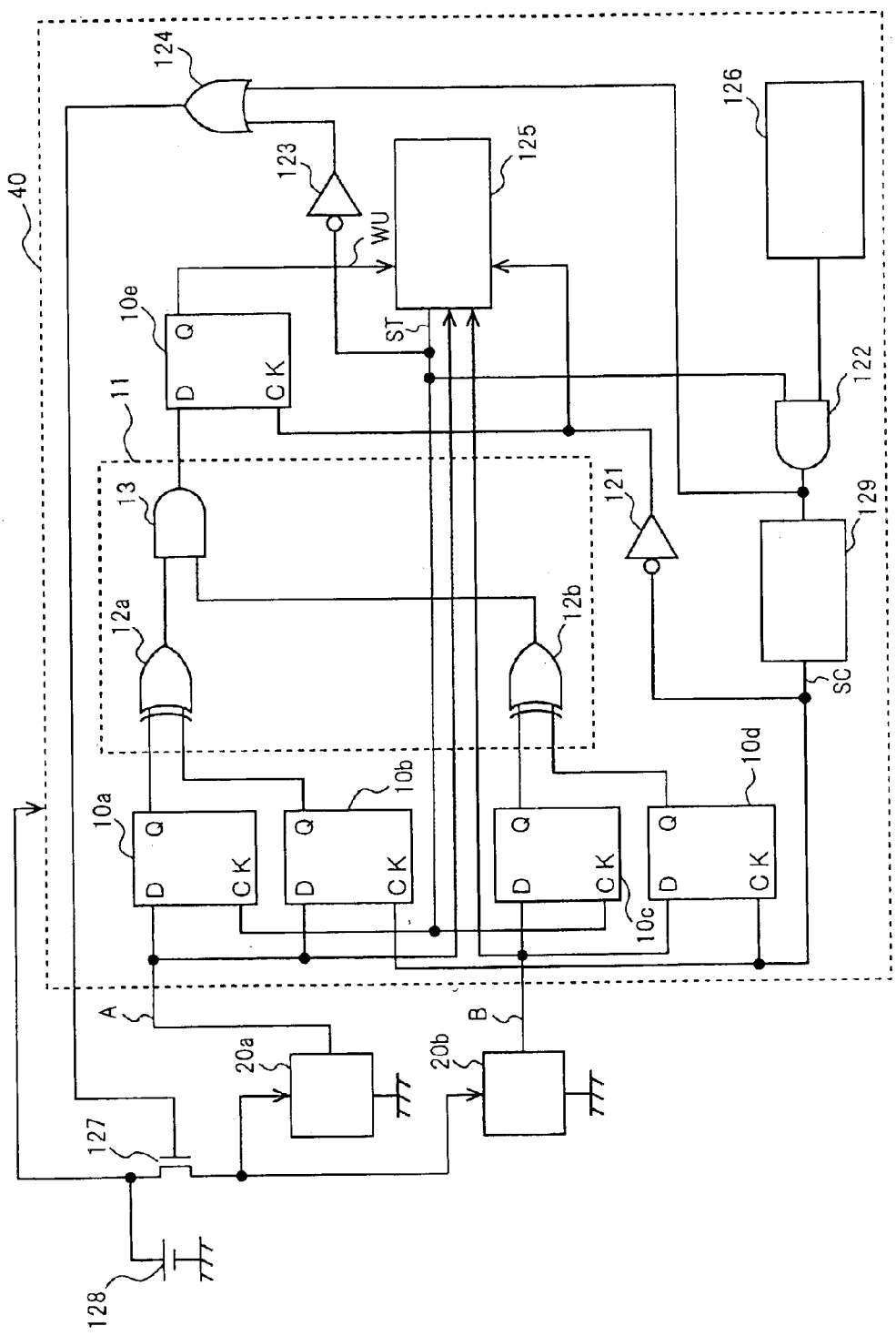
FIG. 4 is a detailed block diagram showing a configuration of a phase detection device in the embodiment 1 according to the present invention.

The phase detection device in an embodiment 1 according to the present invention is described using FIGS. 1–5. FIG. 1 is a block diagram of a main section of a control section of the phase detection device in the embodiment 1 according to the present invention, FIG. 2 is a block diagram of a main section of a phase detection section and the control section of the phase detection device in the embodiment 1 according to the present invention, and FIG. 3 is a block diagram of the main section of a power supply section, the phase detection section and the control section of the phase detection device in the embodiment 1 according to the present invention. FIG. 4 is a detailed block diagram of the phase detection device in the embodiment 1 according to the present invention.

Figure 11:
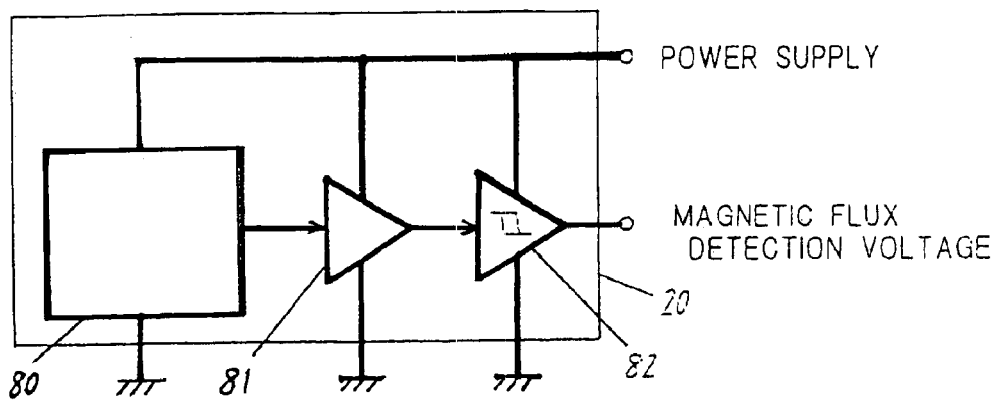
FIG. 11 is a block diagram showing a configuration of a Hall IC.
Figure 12:
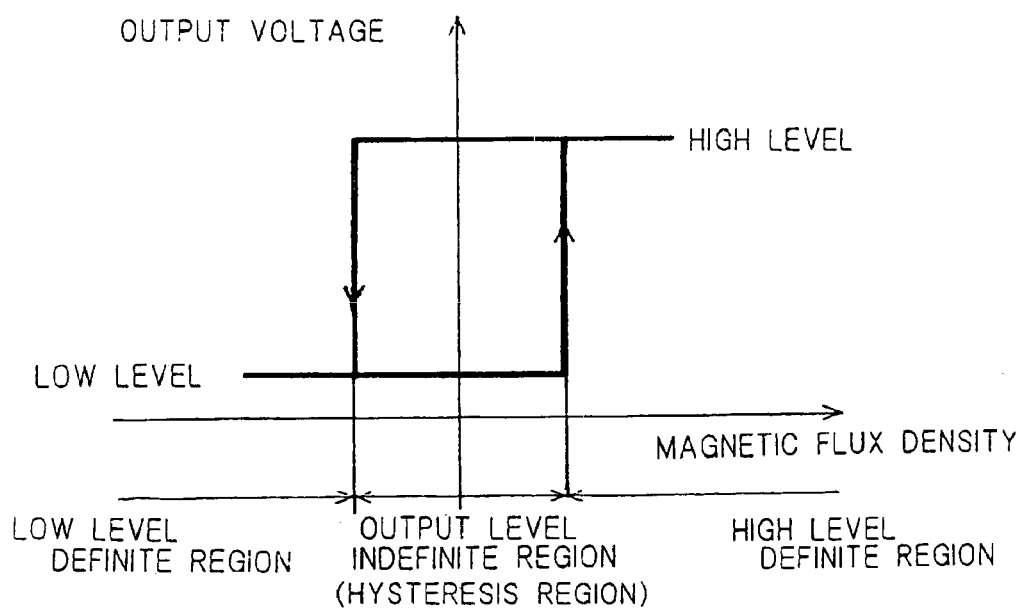
FIG. 12 is an example of a characteristics chart showing the relationship between an input magnetic flux density (horizontal axis) of a Hall IC, and a magnetic flux detection voltage (vertical axis)
Figure 13:
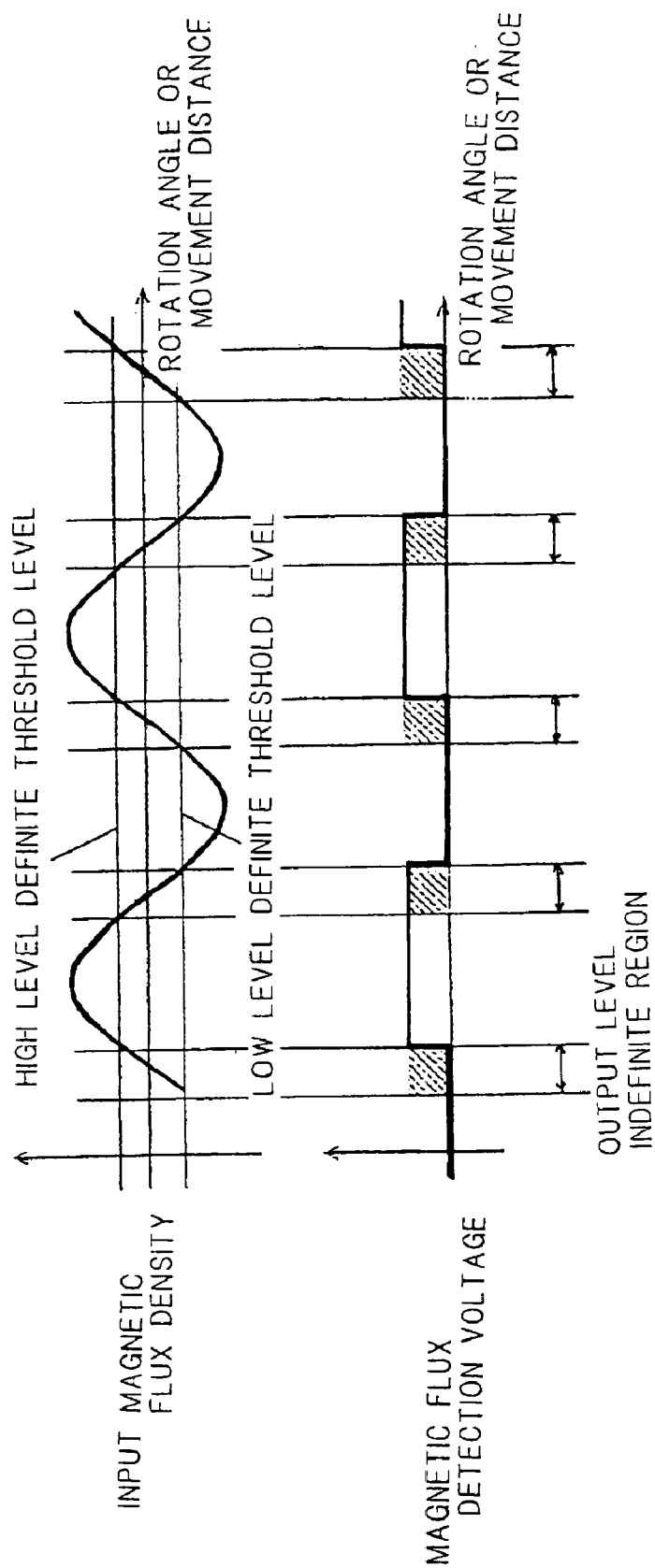
FIG. 13 is a view showing the relationship between an input magnetic flux density with a sign curve, and an output voltage waveform of a phase detector.
Figure 4:
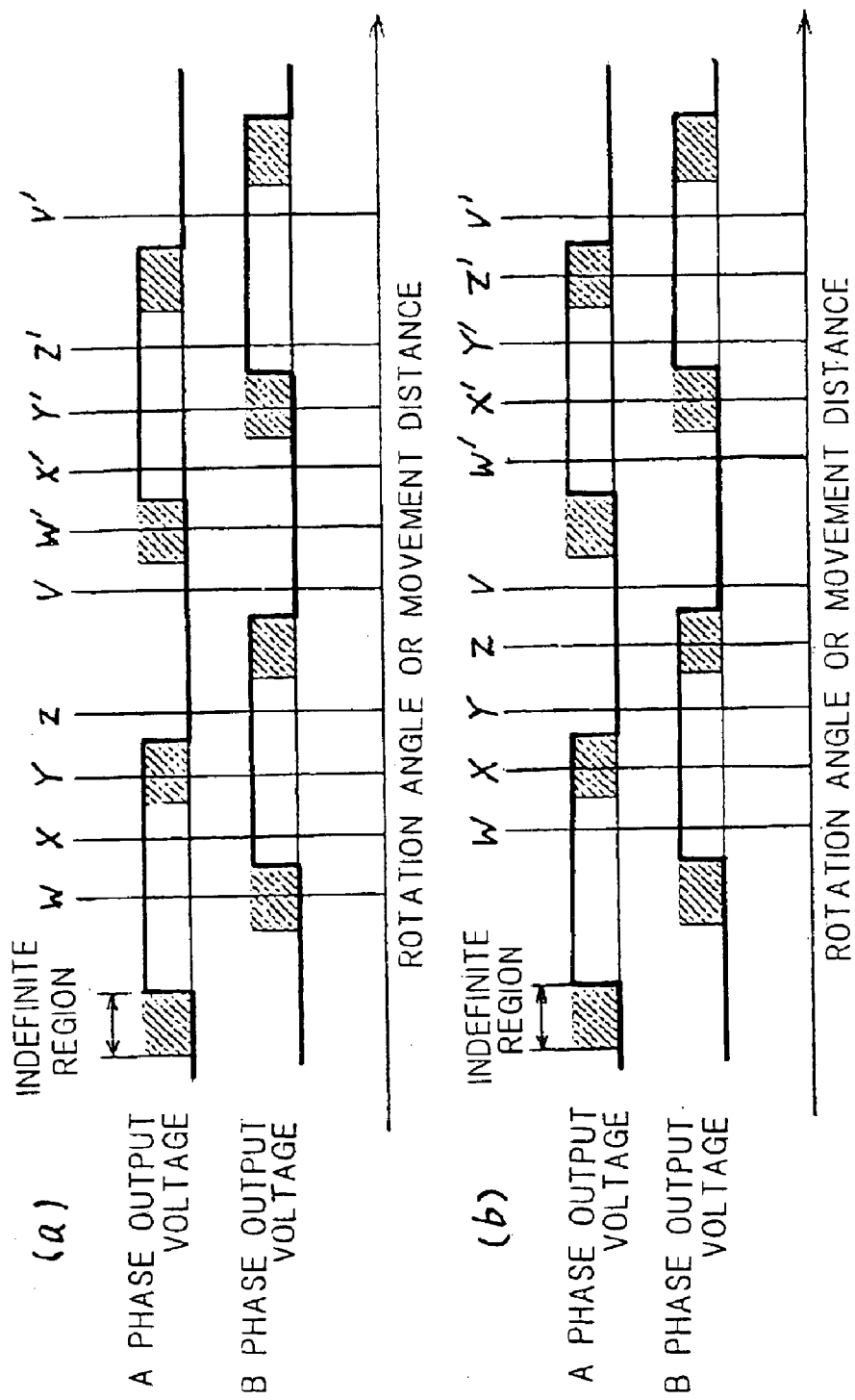

In FIG. 1–FIG. 4, symbol 128 is a battery which is a power supply, symbol 127 is a field-effect transistor (FET) which is a switch for the power, symbols 20a and 20b are Hall ICs which are phase detectors, and symbol 40 is a control section. The Hall ICs 20a and 20b have a configuration shown in FIG. 11. The control section 40 has a first memory section 10a, a second memory section 10b, a third memory section 10c, fourth memory section 10d, an decoder 11, a state control section 125, an OR gate 124, a D flip-flop 10e, inverters 121 and 123, an intermittent operation pulse generation section 126, an AND gate 122, and a delay section 129. In the embodiment 1, the first-fourth memory sections 10a–10d are D flip-flops. The decoder 11 has exclusive OR gates 12a and 12b, and an AND gate 13. The control section 40 is always energized. The Hall ICs 20a and 20b are always energized in an always energized mode, and are intermittently energized in a sleep mode.

The phase detection device in the embodiment 1 is incorporated in a dial type detection device. A configuration of a rotor installed in the dial type detection device has been described in a prior art 1.

For example, in an electronic device, by inputting either of the binarized A phase output signal and B phase output signal which the phase detection devices output (a phase is different from each other by $\pi/2$) into a clock input terminal of a D flip-flop, and inputting the other into a data input terminal, the D flip-flop outputs a rotation direction detection signal (For example, it is Q output signal and a value 0 or 1 indicates a rotation direction.). Furthermore, by inputting the A phase output signal (or the B phase output signal) into a clock input terminal of an UP/DOWN counter, and inputting the rotation direction detection signal into an UP/DOWN switching terminal, a count value of the UP/DOWN counter indicates the rotation direction and the rotation angle of the dial type detection device. The electronic device performs a predetermined process based on information about the rotation direction and the rotation angle of the dial type detection device.

As an approach to reduce a current consumption of the Hall IC and the Hall device, there exists an approach of intermittently driving the power supply of the Hall device portion for every constant cycle. The longer an intermittent cycle is set, and the longer an idle period (hereinafter referred to as sleep period) is taken, the more the consumption current can be reduced, but response to a change in a magnetic field or magnetic flux would deteriorates. If a response speed does not catch up to a movement speed of the rotor or the traveler, an error will arise to a count pulse outputted according to the number of rotations or a movement distance, as a result of this, an incorrect count value and an incorrect direction detection results will be obtained. Since the relationship between the response speed and the current consumption has a trade off relationship, for values of the intermittent cycle and the sleep period, it is needed that suitable values are set according to a purpose of use for the object, to which the detection of the number of rotation and the rotation direction (or an amount of movement and a movement direction) is performed.

This approach for reducing an amount of the current consumption only by intermittently driving the power supply for every constant cycle has a certain limit. In order to further reduce a current consumption with maintaining operability, when there is no change in the phase detection device for a certain period of time, the power supply to these phase detectors is cut off by setting an idle period (sleep period). By supplying the power to the phase detector for every constant cycle in this sleep period, a detection phase of the phase detector is monitored. When the detection phase of the phase detector meets a power activation condition, a state control section generates a power activation condition detection signal, and changes the phase detector into the always energized mode. If the detection phase of the phase detector does not meet the power activation condition, the state control section maintains the sleep period and performs an intermittent operation.

The phase detection device of the embodiment 1, stores the detection phase of the first phase detector 20a and second phase detector 20b just before shifting to the intermittent energized mode (sleep mode) from the always energized mode, and when both the detection phases of the first phase detector 20a and the second phase detector 20b change from the stored detection phases of the first phase detector 20a and the second phase detector 20b in the intermittent operation, changes the power supply section (It consists of the power supply 128 and the FET 127.) from the intermittent energized mode to the always energized mode. Other than it, it is the same as that of a configuration of a prior art 4 shown in FIG. 9. The same symbol is given to the same block as the prior art 4.

The first-fourth memory sections 10a–10d, the decoder 11, and the D flip-flop 10e perform the power activation condition detection function, in which both the first phase detector 20a and the second phase detector 20b detect that the dial or the like (rotor) has moved in the sleep mode. When the power activation condition detection function works, the state control section 125 receives its information, and makes the phase detection device shift to the always energized mode from the sleep mode. In the always energized mode, the state control section 125 outputs ST signal of Low (In the sleep mode, it is High and in the always energized mode, it is Low.) through the inverter 123 and the OR gate 124, and always brings the FET 127 into conduction. The first and the second phase detectors 20a and 20b are always supplied the power from the power supply 128.

The state control section 125 receives the A phase output signal (output signal of the first phase detector 20a) and the B phase output signal (output signal of the second phase detector 20b), and performs the sleep detection function for detecting that the rotor has not moved for a certain period of time. Typically, the state control section 125 receives a constant clock and increments its count, and has a counter for resetting with the edge of the level change of the A phase output signal and/or the B phase output signal, and a magnitude comparator for judging whether an output value of the counter is equal to or more than a constant value. When the magnitude comparator judges that the output value of the counter is equal to or more than the constant value (when the output signals of both the A phase and the B phase output signal have not changed for a certain period of time, when the sleep detection function has worked), the state control section 125 makes the phase detection device shift to the sleep mode (intermittent energized mode) from the always energized mode.

The state control section 125 outputs ST signal of High (sleep mode). The intermittent operation pulse generation section 126 outputs an intermittent operation pulse for performing an intermittent drive for every certain period of time in the sleep mode. The state control section 125 allows the intermittent operation pulse generation section 126 to output the intermittent operation pulse through the AND gate 122 in the sleep mode. The intermittent operation pulse intermittently brings the FET 127 into conduction through the OR gate 124. The first and the second phase detectors 20a and 20b are intermittently supplied the power from the power supply 128. The second memory section 10b and the fourth memory section 10d receive the intermittent operation pulse (SC signal) which is delayed by the delay section 129 (which delays the pulse with the time after the power is supplied to the first and the second phase detectors 20a and 20b until they operate always.) to a clock input terminal, and latch the output signals of the first and the second phase detectors 20a and 20b when the intermittent operation starts (the A phase and the B phase output signals).

Figure 10:
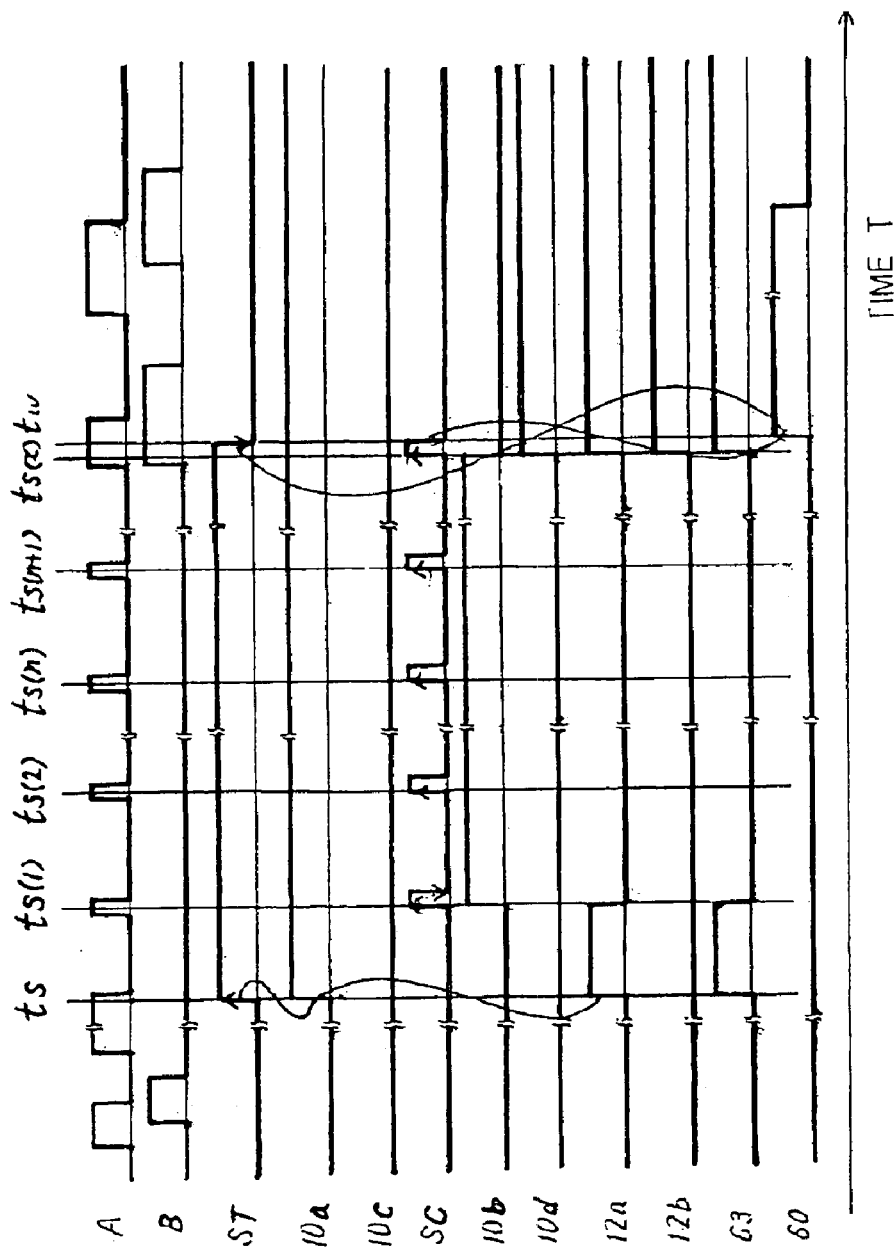
FIG. 10 is a signal waveform diagram of each section of a phase detection device according to the prior art 4.

The exclusive OR gate 12a judges whether the A phase output signal before shifting to the sleep mode and the A phase output signal at the time of each intermittent operation (scanning time ts (1)–ts (n) in FIG. 10) are the same or not, and outputs a judging result (it will be High when they are not the same). The exclusive OR gate 12b judges whether the B phase output signal before shifting to the sleep mode and the B phase output signal at the time of each intermittent operation are the same or not, and outputs a judging result (it will be High when they are not the same). The AND gate 13 receives output signals of the exclusive OR gates 12a and 12b, and outputs High when both are High (when both the A phase output signal and the B phase output signal change). The D flip-flop 10e retrieves an output signal of the AND gate 13 with the rising edge of the inversion signal of SC signal (when the intermittent operation ends), and send an output. The D flip-flop 10e, after becoming sleep mode, has a role for eliminating the output signal (It may be incorrect.) of the AND gate 13 before the first SC signal is outputted. The state control section 125 receives an output signal (it is High when the power activation condition detection function works) of the D flip-flop 10e.

The phase detection devices of this embodiment uses that the first and the second phase detection devices 20a and 20b do not exist in a hysteresis region together (Two phase detection devices are arranged such.). During the intermittent operation, although either of the output signals of the first and the second phase detection devices 20*a* and 20*b* may have outputted false information, at least one of the output signals is correct. When both the A phase output signal and the B phase output signal change, because at least either of them is correct, the control section 40 can correctly judges that the rotor has rotated.

In part (a) of FIG. 14, for example, when the rotor is positioned at the point of W (or W') where the A phase or the B phase output signal have an indefinite region, in the case where the phase detection device enters into the sleep mode, the phase detection device of this embodiment judges that the rotor and the traveler have surely moved when the rotor moves to Y, Z, or V (or Y', Z', or V') point where both the A phase and the B phase output signals change from W (or W') point.

Moreover, in part (b) of FIG. 14, when the rotor is positioned at the point of W (or W') where both the A phase and the B phase output signals become definite points, in the case where the phase detection device enters into the sleep mode, the phase detection devices of this embodiment judges that the rotor and the traveler have surely moved when the rotor moves to Z or V (or Z' or V') point where both the A phase and the B phase output signals change from W (or W') point. In this way, the phase detection device can detect that the rotor or the traveler has moved irrespective of where the stop point of the rotor or the traveler exists.

Figure 5:
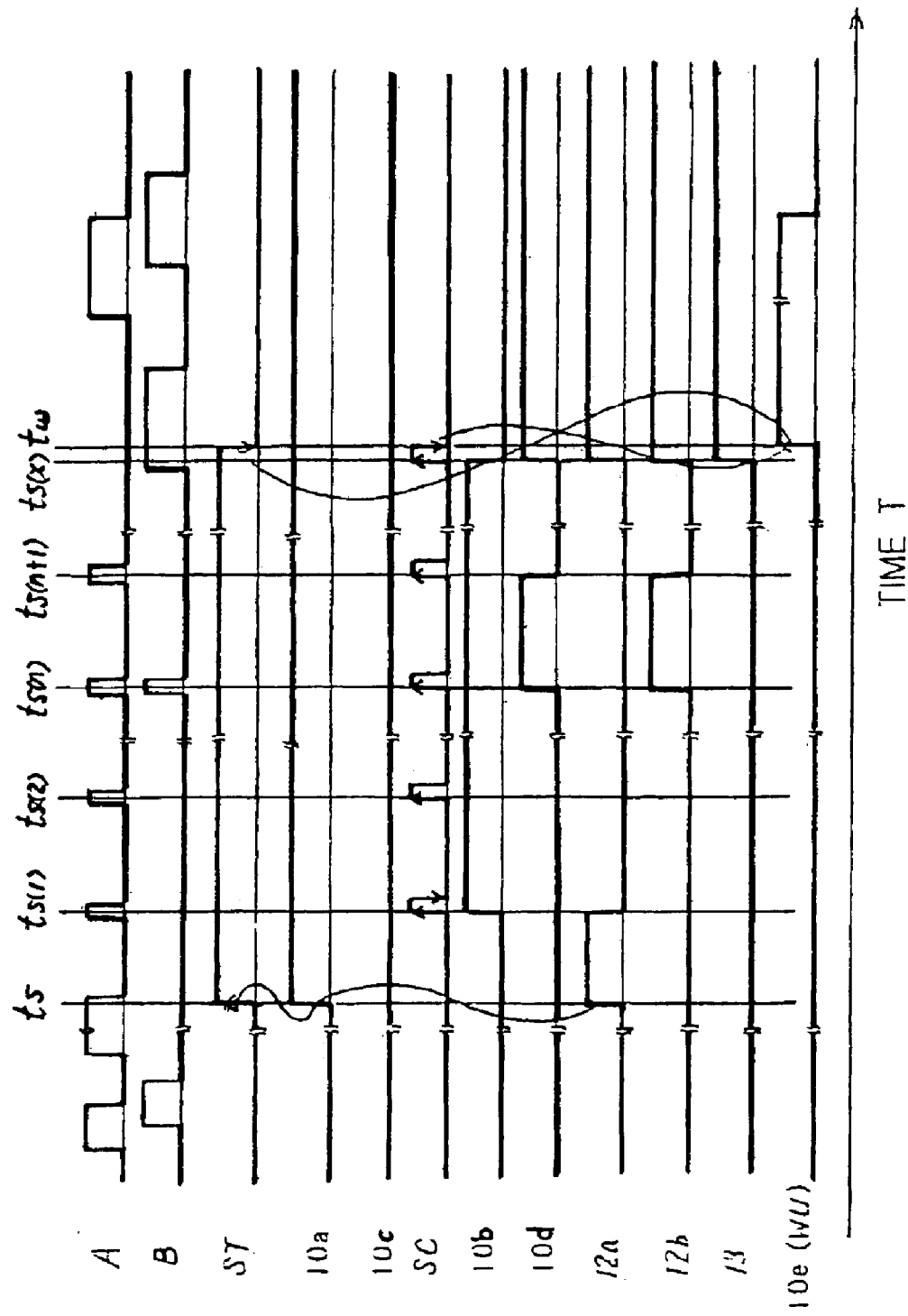
FIG. 5 is a signal waveform diagram of each section of a phase detection device in the embodiment 1 according to the present invention.
Figure 6:
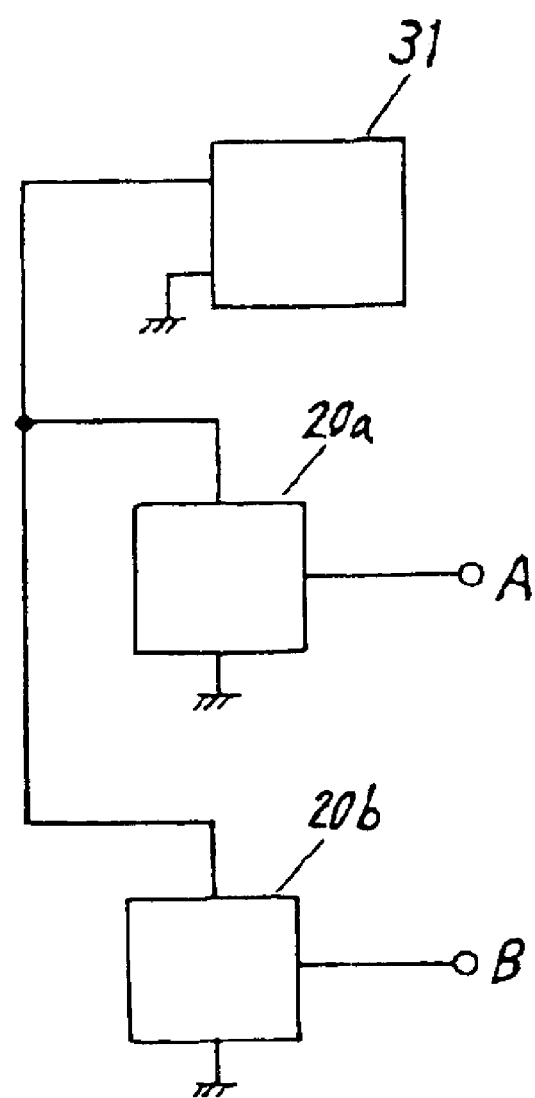
FIG. 6 is a view showing a configuration of a phase detection device of a prior art 1 and a prior art 2.
Figure 7:
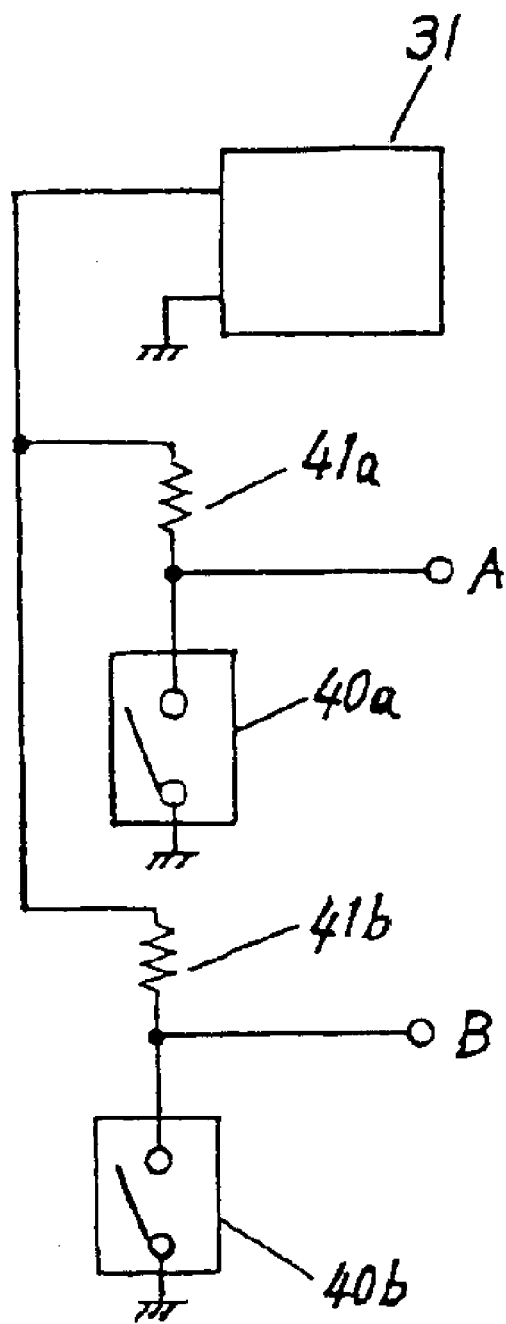
FIG. 7 is a view showing a configuration of a phase detection device of a mechanical system of a prior art 3.
Figure 8:
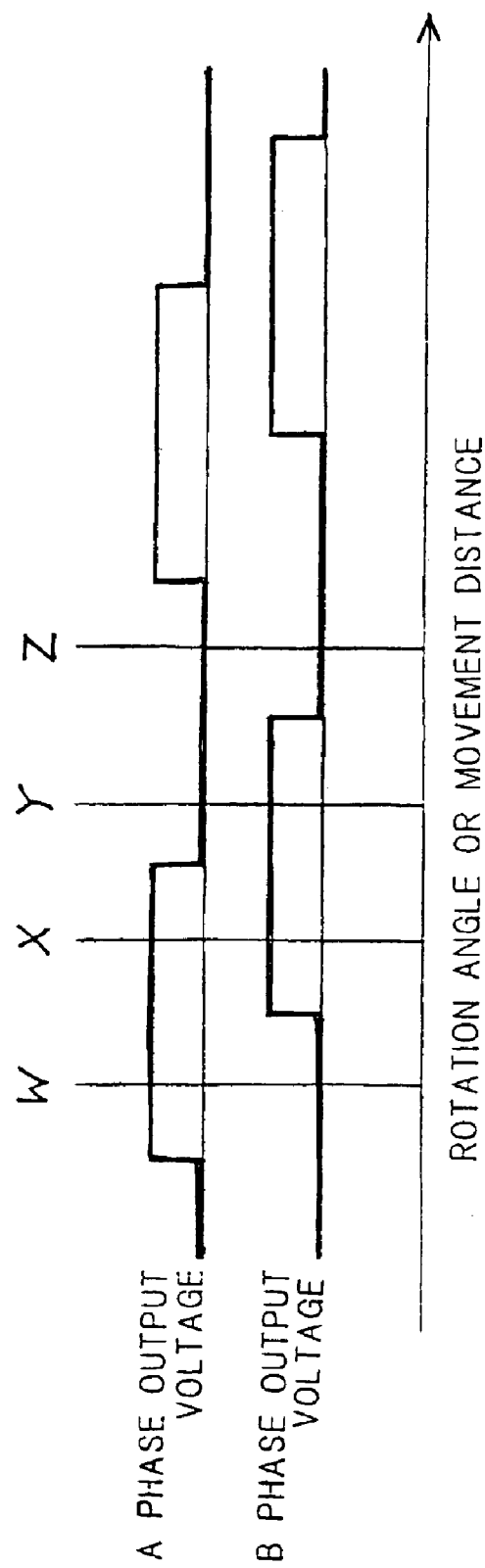
FIG. 8 is a time chart showing an A phase output voltage and a B phase output voltage which a magnetic flux detecting sections output.

Moreover, FIG. 5 shows a signal waveform of each section of the phase detection device of the embodiment 1. In FIG. 5, symbol A is the A phase output signal that the first phase detector outputs, and symbol B is the B phase output signals that the second phase detector outputs. Symbols 10*a*–10*d*, 10*e*, 12*a*, 12*b*, and 13 are the output signals of blocks of the same symbol, respectively. Symbols ST and SC are ST signal and SC signal, respectively. Operation of the phase detection device of the embodiment 1 is described using FIG. 5.

In FIG. 5, first, the state control section 125 is the always energized mode. By the user rotating the dial (rotor) in a certain direction until a certain time, the B phase output signal continuously changes following to the A phase output signal with a phase delay by $\pi/2$. From a certain time to a time ts (predetermined time), the sleep detection function works based on both the A phase output signals and the B phase output signals being unchanged, the state control section 125 shifts to the sleep mode from the always energized mode, and makes the output signal ST (It is High in the sleep mode, and Low in the always energized mode. Referred to as ST signal.) High.

The first memory section 10*a* and the third memory section 10*c* latch the A phase output signal and the B phase output signal (both are binary) just before shifting to the sleep mode with a rising edge of the ST signal. The first memory section 10*a* and the third memory section 10*c* store the A phase output signal and the B phase output signal until the next rising edge of the ST signal arrives, and input those signals into the exclusive OR gates 12*a* and 12*b*, respectively.

Subsequently, based on a command from the state control section 125, the FET 127 cuts off the power supply to two phase detectors 20*a* and 20*b*. Therefore, the A phase output signal and the B phase output signal becomes Low. Subsequently, an intermittent operation command is sent to the FET 127 for every predetermined period from the intermittent operation pulse generation section 126, and the FET 127 supplies the power to two phase detectors for every predetermined period. Only during the sleep period, the intermittent operation pulse generation section 126 intermittently outputs the SC signal through the AND gate 122. The second memory section 10*b* and the fourth memory section 10*d* latch the A phase output signal and the B phase output signal (both are binary) with the rising edge of the SC signal. The second memory section 10*b* and the fourth memory section 10*d* store the A phase output signal and the B phase output signal until the next rising edge of the SC signal arrives, and input those signals into the exclusive OR gates 12*a* and 12*b*, respectively.

The output signal of the exclusive OR gate 12*a* is a logic change judging result between the A phase output signal before shifting to the sleep mode and the A phase output signals at each scanning time ts (1)–ts (n). The output signal of the exclusive OR gate 12*b* is a logic change judging result between the B phase output signal before shifting to the sleep mode and the B phase output signals at each scanning time. The AND gate 13 receives the output signal of the exclusive OR gates 12*a* and 12*b*, and outputs a logical product of those. When values of both the A phase output signal and the B phase output signal change from values just before changing to the sleep mode, the output signal of the AND gate 13 becomes High.

Since a state between the time ts and the time ts (1) is in a state where the first scanning signal has not arrived yet, the value which the second memory section 10*b* and the fourth memory section 10*d* latch are not correct, so the output of the AND gate 13 during this period can not be used as it is. The D flip-flop 10*e* prevents the output signal of the AND gate 13 until the first scanning signal is outputted from being inputted into the state control section 125.

Hereafter, the process of the power activation condition detection after the time ts (1) until the time tw when the sleep period moves out is described according to FIG. 5.

With the rising edge of the SC signal at the time ts (1), the A phase output signal and the B phase output signal are latched by the second memory section 10*b* and the fourth memory section 10*d*. The data output of the second memory section 10*b* is inverted from Low to High, and since the output of exclusive OR gate 12*a* is Low and the output of the exclusive OR gate 12*b* is still Low, the output of the AND gate 13 becomes Low and the sleep period is maintained. Since the D flip-flop 10*e* retrieves the correct output signal of the AND gate 13 with the back edge of the SC signal generated first after the time ts (1), a signal WU is still Low and the sleep period is maintained. At the time ts (n), it is in the state where the magnetic flux corresponding to the level within an upper limit and a lower limit of threshold values of hysteresis of an input magnetic flux density is inputted into the second phase detector 20*b*. When the second phase detector 20*b* outputs High which is the indefinite output by the intermittent operation, the output signal of the fourth memory section 10*d* (Q output signal) is reversed with the front edge of the SC signal and becomes at a High state, although the output of the exclusive OR gate 12*b* is inverted to High, since the output of the exclusive OR gate 12*a* is maintained in Low, the output signal of the AND gate 13 is maintained in Low without any change. The signal WU is also maintained in Low. The sleep period is maintained. At the time ts (x), when both the A phase output signal and the B phase output signal-just before shifting to the sleep mode, and the A phase output signal and the B phase output signal at the scanning time change, the outputs of the exclusive OR gates 12*a* and 12*b* both become High, and the output of the AND gate 13 changes to High. The state control section 125 receives the output signal of the AND gate 13, namely, the output signal WU of the D flip-flop 10e (power activation condition detection signal, active at High). The state control section 125 changes from the sleep mode to the always energized mode. The state control section 125 brings the FET 127 into conduction, and the FET 127 commonly supplies the power to two phase detectors.

<<Embodiment 2>>

Figure 15:
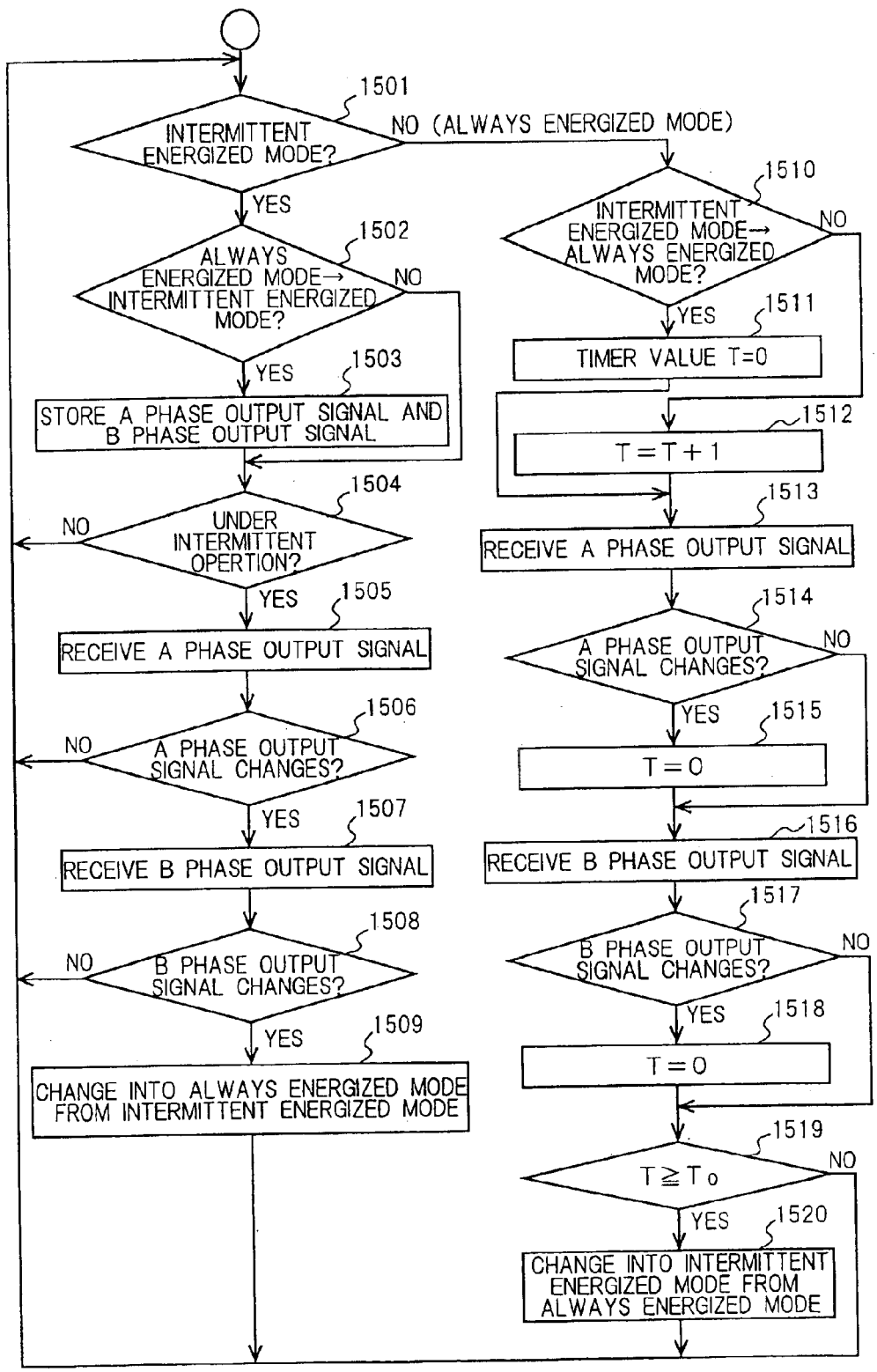
FIG. 15 is a flow chart showing a configuration of a phase detection method in an embodiment 2 according to the present invention.

The phase detection device in an embodiment 2 according to the present invention is described using FIG. 15. In the phase detection device in the embodiment 2 according to the present invention, the control section 40 consists of a microcomputer in FIG. 4. In other respects, the phase control device of the embodiment 2 is the same as that of the embodiment 1 (FIG. 1). FIG. 15 is a flow chart showing a configuration of the phase detection method in the embodiment 2 according to the present invention (The microcomputer which is the control section 40 performs.). The phase detection method in the embodiment 2 is described.

First, the microcomputer confirms whether the phase detection device is in the intermittent energized mode (sleep mode) or not (step 1501). When the device is in the intermittent energized mode, the process proceeds to step 1502, if not, the process proceeds to step 1510 (when the device is in the always energized mode).

At step 1502, when the device has just changed into the intermittent energized mode from the always energized mode, the A phase output signal and the B phase output signal at that moment are received and stored (step 1503), and, subsequently, the power supply to the first and the second phase detectors 20a and 20b are cut off.

Next, it is checked whether the device is under the intermittent operation (the first and the second phase detectors 20a and 20b are under energization) or not. When the device is not under the intermittent operation, the process returns to step 1501. When the device is during the intermittent operation, the process proceeds to step 1505.

At step 1505, the A phase output signal is received. Next, it is checked whether the A phase output signal has changed from a value stored at step 1503 or not (step 1506). If not, the process returns to step 1501. If it has changed, the process proceeds to step 1507.

At step 1507, the B phase output signal is received. Next, it is checked whether the B phase output signal has been changed from a value stored at step 1503 or not (step 1508). If not, the process returns to step 1501. If it has changed, the process proceeds to step 1509.

When both the A phase and the B phase output signals have changed, the microcomputer changes the device into the always energized mode from the intermittent energized mode (step 1509). The process returns to step 1501.

At step 1510 (always energized mode), when the device has just changed into the always energized mode from the intermittent energized mode, a timer value T is reset to 0 (step 1511), if not, the timer value is incremented (step 1512).

At step 1513, the A phase output signal is received and stored. Next, it is checked whether or not the A phase output signal has changed from the value stored at previous step 1513 (step 1514), and if it has changed, the timer value T is reset.

At step 1516, the B phase output signal is received and stored. Next, it is checked whether or not the B phase output signal has changed from the value stored at previous step 1516 (step 1517), and if it has changed, the timer value T is reset.

Next, it is checked whether or not the timer value T is equal to or more than a predetermined threshold value T0, and if it is equal to or more than the predetermined threshold value (if neither the A phase nor the B phase output signal have changed for a predetermined time period), the microcomputer changes the device into the intermittent energized mode from the always energized mode (step 1520). The process returns to step 1501.

In the embodiment 2, the changes of both the A phase output signal and the B phase output signal are checked, and the time T when the rotor has stopped is measured. Instead of this, the change of either the A phase output signal or the B phase output signal may be checked.

According to the above configuration, it is possible for the phase detection device of the embodiment 2 to obtain a similar effect to that of the embodiment 1.

<<Embodiment 3>>

Figure 9:
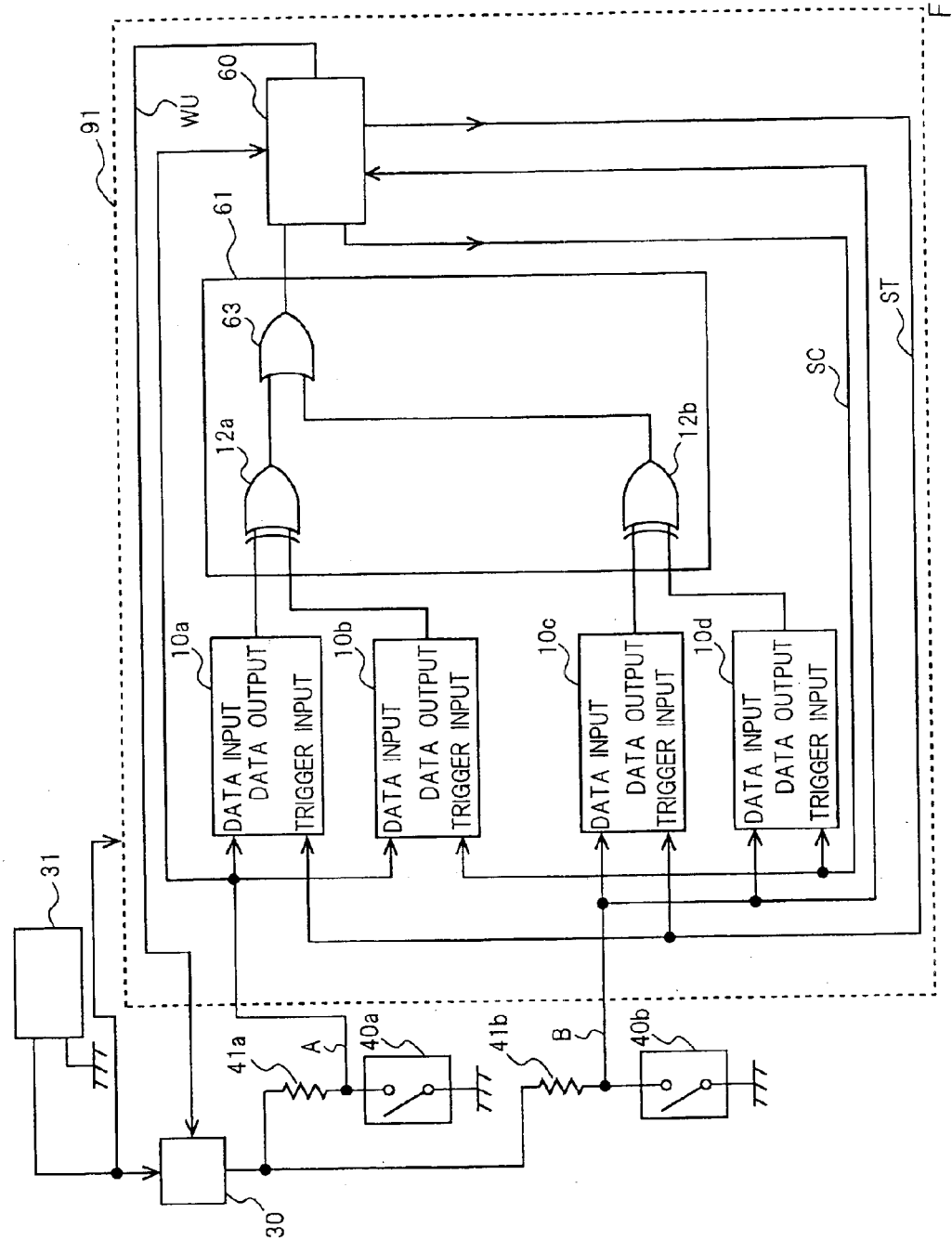
FIG. 9 is a view showing a configuration of a phase detection device of a mechanical system of a prior art 4 having an intermittent energized mode.
Figure 16:
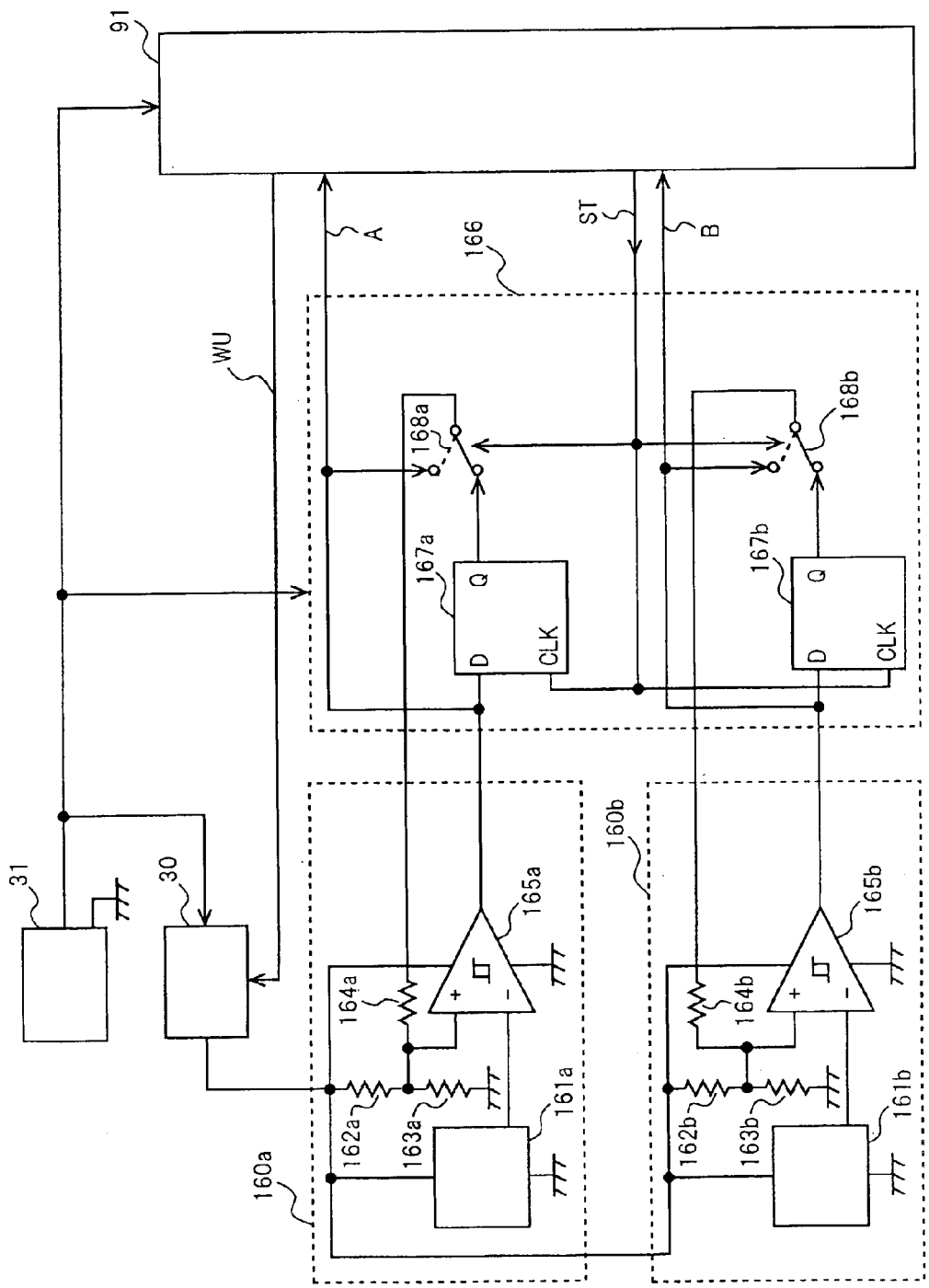
FIG. 16 is a block diagram showing a configuration of a phase detection device of a embodiment 3 according to the present invention. Some or all of the drawings are drawn by a general outline for the purpose of showing a figure, and it will be taken into considerations that the actual relative sizes or locations of the elements shown therein are not necessarily drawn truly.

The phase detection device in an embodiment 3 according to the present invention is described using FIG. 16. The phase detection device in the embodiment 3 according to the present invention has a configuration wherein, in FIG. 9 (prior art 4), the first phase detector (resistor 41a and switch 40a) and the second phase detector (resistor 41b and switch 40b) are replaced to Hall ICs 160a and 160b and a holding section 166. In other respects, the phase control device of the embodiment 3 is the same as that of the prior art 4 (FIG. 9). FIG. 16 is a block diagram showing a configuration of the phase detection device in the embodiment 3 according to the present invention. A configuration of a control section 91 is described in FIG. 9. The phase detection device in the embodiment 3 is described.

The phase detection device of the embodiment 3 comprises memory sections 167a and 167b for storing an output state of an amplifier (which amplifies a detection signal of the Hall device and binarizes it.) having a hysteresis characteristic just before a power supply cutoff. The output state of the amplifier having the hysteresis characteristic just before the power supply cutoff is also reproducible during the intermittent operation. Thereby, even when the input magnetic flux of the Hall device has a level within a hysteresis region, a phase signal with continuity can be obtained (an output signal does not become indefinite), as a result of this, it is possible to detect correctly whether the rotor has rotated or not even during the intermittent operation.

In FIG. 16, the Hall IC 160a has a Hall device 161a, resistors 162a, 163a, and 164a, and a comparator 165a (first binarization section). The Hall IC 160b has a Hall device 161b, resistors 162b, 163b, and 164b, and a comparator 165b (second binarization section). A holding section 166 has a fifth memory section (D flip-flop) 167a, a switch 168a, a sixth memory section (D flip-flop) 167b, and a switch 168b.

In the sleep mode, the Hall ICs 160a and 160b are intermittently energized and the holding section 166 and the control section 91 are always energized.

The Hall devices 163a and 163b detect a magnetic field (magnetic flux) with a phase difference of $\pi/2$, and output an analog signal depending on the magnetic flux. The comparator 165a has a configuration wherein its output signal or an output signal of the D flip-flop 167a is positively fed back to a non-inverting input terminal through the resistor 164a. The comparator 165a receives an output signal of the Hall device 163a to an inverting input terminal and binarizes it. The comparator 165a has hysteresis defined by the resistors 162a, 163a, and 164a. The comparator 165b has a configuration wherein its output signal or an output signal of the D flip-flop 167b is positively fed back to a non-inverting input terminal through the resistor 164b. The comparator 165b receives an output signal of the Hall device 163b to an inverting input terminal and binarizes it. The comparator 165b has hysteresis defined by the resistors 162b, 163b, and 164b.

The control section 91 (state control section 60) inputs the ST signal (In the sleep mode, it is High and in the always energized mode, it is Low.) into clock input terminals of D flip-flops 167a and 167b. The D flip-flops 167a and 167b latch the output signals of the comparators 165a and 165b with the rising edge of the ST signal (when it becomes the sleep mode). The switches 168a and 168b are controlled by the ST signal, connected to the solid line side in the sleep mode, and connected to the broken line side in the always energized mode. In the always energized mode, the output signal of the comparator 165a is positively fed back to the non-inverting input terminal through the resistor 164a, and the output signal of the comparator 165b is positively fed back to the non-inverting input terminal through the resistor 164b. The configuration and the operation in this case are the same as that of the prior art Hall IC.

In the sleep mode, the output signal of the D flip-flop 167a is positively fed back to the non-inverting input terminal of the comparator 165a through the resistor 164a, and the output signal of the D flip-flop 167b is positively fed back to the non-inverting input terminal of the comparator 165b through the resistor 164b. Since the holding section 166 (The D flip-flops 167a and 167b are included.) is always energized even in the sleep mode, During the intermittent operation, the comparators 165a and 165b operate in the state when starting the sleep mode. That is, the comparators 165a and 165b output the A phase and the B phase output signal with the continuity from the start of the sleep mode (It does not become indefinite.), even when the magnetic field (magnetic flux), which the Hall devices 160a and 160b input, is within those hysteresis regions.

According to the above configuration, the phase detection device according to the present invention accurately detects that the rotor has rotated, and changes the sleep mode into the always energized mode.

In the above embodiment, the phase detection device has been incorporated in the dial type detection device. Instead of this, the phase detection device according to the present invention may be installed in other operation input devices (for example, control lever).

In the above embodiment, the Hall IC has been employed. Instead of this, phase detection sections such as an arbitrary magnetic system, an optical system or the like with the hysteresis may be employed.

The phase detection device and the phase detection method according to the present invention are useful as the phase detection device and phase detection method of the dial type detection device. The dial type detection device according to the present invention is useful as the operation input section of portable electronic devices. Although the present invention has been described about the preferred embodiments in certain details, it will be apparent that various modifications and variations can be made to the present disclosed contents of this preferred embodiment in detail portions of the configuration, and combinations of each element or variations of the step can be made without departing from the scope and spirit of the invention as claimed.

What is claimed is:

1. A phase detection device, comprising:
   a first phase detector having a first detecting section for detecting a phase of an object, and a first binarization section for binarizing the phase which said first detecting section has detected by setting hysteresis;
   a second phase detector having a second detecting section for detecting a phase of the object in a phase different from said first phase detector, and a second binarization section for binarizing the phase which said second detecting section has detected by setting the hysteresis;
   a power supply section having an always energized mode for always supplying a power to said first phase detector and said second phase detector, and an intermittent energized mode for intermittently supplying the power to said first phase detector and said second phase detector; and
   a control section for, in said always energized mode, when detection phases of said first phase detector and/or said second phase detector do not change for more than a predetermined time, making the power supply section shift to said intermittent energized mode, and in said intermittent energized mode, storing the detection phases of said first phase detector and said second phase detector just before shifting to said intermittent energized mode from said always energized mode, and when both the detection phases of said first phase detector and said second phase detector change from the stored detection phases of said first phase detector and said second phase detector, changing the power supply section from said intermittent energized mode to said always energized mode.

2. A phase detection device according to claim 1, characterized in that said control section comprises:
   a first exclusive OR gate for receiving a stored detection phase of said first phase detector, and a phase which said first phase detector outputs;
   a second exclusive OR gate for receiving a stored detection phase of said second phase detector and a phase which said second phase detector outputs; and
   an AND gate for receiving an output signal of said first exclusive OR gate and an output signal of said second exclusive OR gate, wherein
   in said intermittent energized mode, when said AND gate outputs a signal indicating that both detection phases of said first phase detector and said second phase detector have changed, the power supply section is changed from said intermittent energized mode to said always energized mode.

3. A phase detection device according to claim 2, characterized in comprising:
   a first memory section for storing the phase which said first phase detector outputs, using a sleep signal indicating said intermittent energized mode as a trigger input;
   a second memory section for storing the phase which said first phase detector outputs, using a scanning signal outputted when said power supply section intermittently supplies the power in said intermittent energized mode as a trigger input;
   a third memory section for storing the phase which said second phase detector outputs, using said sleep signal as a trigger input; and
   a fourth memory section for storing the phase which said second phase detector outputs, using said scanning signal as a trigger input, wherein
   said first exclusive OR gate receives an output signal of said first memory section and an output signal of said second memory section; and said second exclusive OR gate receives an output signal of said third memory section and an output signal of said fourth memory section.

4. A phase detection device according to claim 1, characterized in that said first phase detector and said second phase detector detect magnetic flux, magnetic fields, or changes therein.

5. A dial type detection device, characterized in comprising a phase detection device according to claim 1.

6. A phase detection device, comprising:

a first phase detector having a first detecting section for detecting a phase of an object, a first binarization section for binarizing the phase by receiving the phase which said first detecting section detects and by feeding back a signal which a fifth memory section stores for setting hysteresis, and said fifth memory section for storing an output signal of said first binarization section;

a second phase detector having a second detecting section for detecting a phase of the object in a phase different from said first phase detector, a second binarization section for binarizing the phase by receiving the phase which said second detecting section detects and by feeding back a signal which a sixth memory section stores for setting hysteresis, and said sixth memory section for storing an output signal of said second binarization section;

a power supply section having an always energized mode for always supplying a power to said first detecting section and said second detecting section, and an intermittent energized mode for intermittently supplying the power to said first phase detecting section and said second phase detecting section; and a control section for, in said always energized mode, when detection phases of said first phase detector and said second phase detector do not change for more than a predetermined time, making the power supply section shift to said intermittent energized mode, and in said intermittent energized mode, storing the detection phases of said first phase detector and said second phase detector just before shifting to said intermittent energized mode from said always energized mode, and when at least either of detection phases of said first phase detector and said second phase detector changes from the stored detection phases of said first phase detector and said second phase detector, changing the power supply section from said intermittent energized mode to said always energized mode.

7. A phase detection method, comprising:

an always energized mode having a first phase detection step for detecting a phase of an object by always supplying a power to a first detector, and binarizing the detected phase by setting hysteresis, and a second phase detection step for detecting a phase of the object in a phase different from said first phase detection step by always supplying the power to a second detector, and binarizing the detected phase by setting hysteresis; and an intermittent energized mode having a first phase detection step for detecting a phase of the object by intermittently supplying the power to the first detecting section, and binarizing the detected phase by setting hysteresis, and a second phase detection step for detecting a phase of the object in a phase different from said first phase detection step by intermittently supplying the power to a second detecting section, and binarizing the detected phase by setting hysteresis, wherein in said always energized mode, when detection phases of said first phase detector and said second phase detector do not change for more than a predetermined time, shift to said intermittent energized mode occurs, and in said intermittent energized mode, the detection phases of said first phase detector and said second phase detector just before shifting to said intermittent energized mode from said always energized mode are stored, and when both the detection phases of said first phase detector and said second phase detector change from the stored detection phases of said first phase detector and said second phase detector, change from said intermittent energized mode to said always energized mode occurs.

* * * * *